United States Patent [19]

Lehmann et al.

[11] 4,124,473
[45] Nov. 7, 1978

[54] FABRICATION OF MULTI-LEVEL RELIEF PATTERNS IN A SUBSTRATE

[75] Inventors: Hans W. Lehmann, Hedingen; Roland W. Widmer, Rümland, both of Switzerland

[73] Assignee: RCA Corporation, New York, N.Y.

[21] Appl. No.: 807,482

[22] Filed: Jun. 17, 1977

[51] Int. Cl.² ............................................. C23C 15/00
[52] U.S. Cl. ................................................ 204/192 E
[58] Field of Search .................... 204/192 E, 192 EC; 156/643

[56] References Cited

U.S. PATENT DOCUMENTS

| 3,971,684 | 7/1976 | Muto ...................................... 156/13 |
| 3,975,252 | 8/1976 | Fraser et al. ...................... 204/192 E |
| 3,984,301 | 10/1976 | Matsuzaki et al. ................ 204/192 E |

OTHER PUBLICATIONS

N. Hosokawa et al., "RF Sputter Etching by Fluoro–Chloro–Hydrocarbon Gases," *Proc. 6th Int'l. Vac. Cong.* (1974), pp. 435–438.

J. A. Bondur et al., "RF Reactive Ion Etching of Polysilicon with Fluorocarbon Gas", *IBM Tech. Disc. Bull.*, vol. 18, p. 1897, (1975).

J. A. Bondur, "Dry Process Technology (Reactive Ion Etching)", *J. Vac. Sci. Tech.*, vol. 13, pp. 1023–1029, (1976).

*Primary Examiner*—John H. Mack
*Assistant Examiner*—Aaron Weisstuch
*Attorney, Agent, or Firm*—H. Christoffersen; Birgit E. Morris

[57] ABSTRACT

Superposed multi-level diffraction gratings in photoresist can be etched into a substrate by using the photoresist as a masking pattern and by sputtering in a reactive fluoromethane plasma to a predetermined depth.

2 Claims, 9 Drawing Figures

FABRICATION OF MULTI-LEVEL RELIEF PATTERNS IN A SUBSTRATE

This invention relates to a method of preparing multi-level surface relief patterns in a substrate. More particularly, this invention relates to a method of preparing multi-level square wave gratings in a hard durable substrate.

BACKGROUND OF THE INVENTION

U.S. Pat. No. 3,957,354 describes a diffractive subtractive color filtering technique whereby color information is recorded as a square wave grating surface relief pattern in a photoresist layer of a given thickness which corresponds to the amplitude of a given primary color. By recording separately for the three primary colors in the proper thickness for each and placing the recordings in series and proper registration with each other, a full color picture can be derived.

Thus three photoresist recordings are made from which metal stampers can be prepared to provide masters from which a replica, e.g., a transparent thermoplastic sheet, can be prepared with the surface relief patterns embossed in it. The complete color picture is reconstructed by sandwiching the three subtractive primary color components, i.e., each having a surface relief pattern of a different depth. The depth dimensions of any of these relief patterns is on the order of 2 micrometers or less.

A more compact method of recording is described in U.S. Pat. No. 4,082,453, filed June 9, 1976, incorporated herein by reference, whereby two of the three color components can be recorded together. A layer of photoresist is chosen so that, after development, unexposed regions of photoresist will be equal in thickness to the sum of the amplitudes of two superposed two-level diffraction structures. The resultant surface relief pattern thus has a stepwise configuration with multi-levels. The third color is recorded separately as before. The final embossed sheet can be embossed on one side with the multi level pattern and on the other side with the third pattern, thus obviating the need for sandwiching two or more embossed sheets together.

Copending application of Gale et al, Ser. No. 705,931 filed July 17, 1976, now abandoned, discloses a method whereby all colors can be recorded in a single surface relief pattern. According to this method, a surface relief pattern in a first desired depth is recorded in photoresist on a substrate and developed, a layer of metal or a silicon oxide is evaporated onto the photoresist pattern and the photoresist removed, leaving a silicon oxide pattern of that depth on the substrate. A second layer of photoresist is applied which will provide a depth for the second color pattern, the photoresist exposed and developed to form a bilevel pattern superposed on the first pattern; a second evaporated layer is applied and the photoresist removed. By repeating these steps, multi-level patterns of the evaporated layer are formed on the substrate. Since the evaporated layers are hard and durable, they can be used directly as a master for embossing the multilevel pattern into thermoplastic films.

Alternatively, a multi-level pattern can be made by subtracting material from the substrate, as by sputter etching or plasma etching the photoresist pattern. After developing the first photoresist pattern, the exposed substrate and photoresist surfaces are etched away to the first pattern depth corresponding to one primary color. The photoresist layer thickness is chosen so that some photoresist remains when the first depth in the substrate is obtained. The photoresist is removed when etching is terminated. A second layer of photoresist is then applied, exposed and developed and a second etching step carried out to etch to the second pattern depth corresponding to another primary color. These steps are repeated for the third pattern depth corresponding to the third primary color.

It will be appreciated that the quality of the reconstructed color picture depends on the squareness and the ratio of groove width to line width of the individual square wave gratings in the multi-level relief pattern. At pattern periodicities of 5 microns or more, evaporation methods and sputter etching or plasma etching methods work well. However, problems are encountered with patterns of less than 5 microns periodicity.

In the additive method, evaporated coatings tend to assume a trapezoidal, rather than a square shape, probably due to a shadowing effect, unless great care is taken to avoid this.

Conventional sputter etching of a photoresist layer on a substrate using argon as the sputtering gas, tends to produce a slant walled pattern, probably due to redeposition of sputtered material on the substrate because of collisional scattering in the gas phase.

Conventional plasma or chemical etching of a fine photoresist layer on a substrate produces severe undercutting, which causes problems during replication.

An improved method for forming straight walled square wave surface relief patterns of micron dimensions would be highly desirable for this application.

SUMMARY OF THE INVENTION

We have found that photoresist can be used as a masking pattern for reactive sputter etching. The sputtering is done in the presence of a gas which forms reactive species on the substrate when bombarded with active ions. These reactive species react with the substrate to form volatile compounds which can be readily removed. Redeposition of the sputtered species is thereby avoided and square wave gratings of micron or submicron dimensions, having greatly improved profiles, can be sputter etched into the substrate.

DETAILED DESCRIPTION OF THE INVENTION

The present process, which we describe as reactive sputter etching, combines the fidelity of profile replication of conventional sputter etching while avoiding the redeposition of sputtered species and the high etch rates of plasma etching, but without undercutting.

Figure 1:
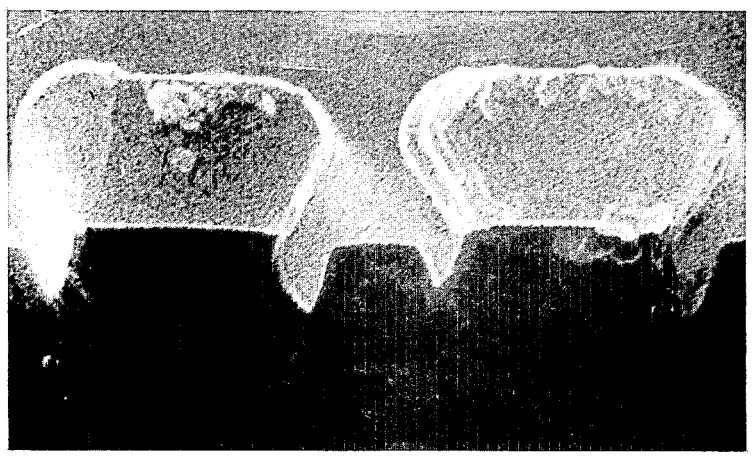
FIGS. 1-3 are photomicrographs of prior art surface relief patterns.
Figure 2:
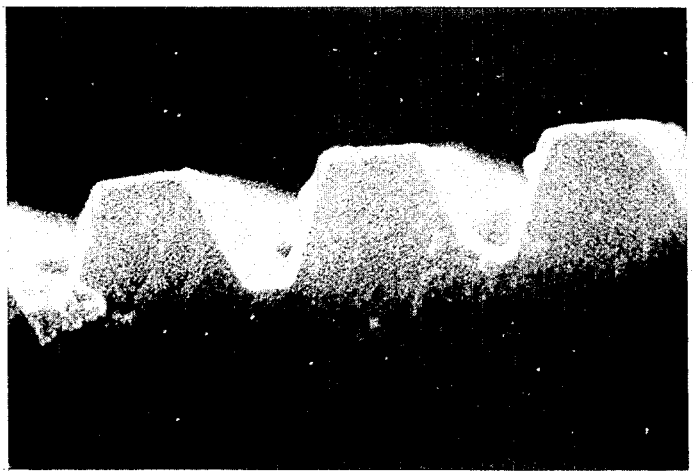
Figure 3:
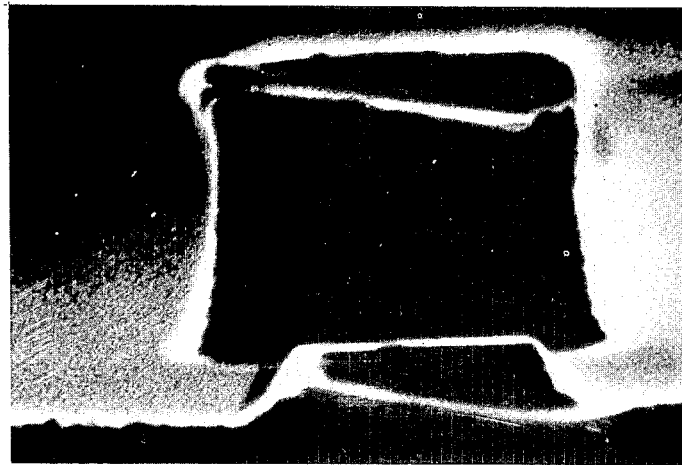

FIGS. 1-3 illustrate some of the problems encountered using the prior art methods.

FIG. 1 is a photomicrograph of an evaporated coating of silicon monoxide on a developed AZ 1350H photoresist (from The Shipley Co.) pattern having a grating of 5 microns periodicity at a magnification of 13,400 times. At smaller dimensions, the distortion leading to a trapezoidal, rather than a square shape, becomes magnified.

FIG. 2 is a photomicrograph of a sputter etched grating in silicon monoxide wherein the pattern has a periodicity of 2.8 microns at a magnification of 14,300 times. A slant walled pattern is apparent.

FIG. 3 is a photomicrograph of a plasma etched grating line of a square wave grating having a periodicity of 5 microns in silicon nitride masked by photoresist, magnified 28,000 times. The etch gas employed was $CF_4$ at a pressure of 1 torr and the etching was done at a power of 50 watts. The undercutting is quite apparent.

In conventional sputter etching, performed under vacuum, the mean free path of a gas molecule at a pressure of about 10 millitorr is about 0.5 mm. However, since the electrodes are about 4 cm apart, a large portion of the sputtered molecules do not reach the counterelectrode, but are scattered in the gas phase and fall back on the substrate, reducing the etch rate and degrading the profile. By sputter etching in an atmosphere of a gas which forms reactive species on the substrate surface by ion-induced dissociation, which species then react with the surface so as to form volatile compounds, the volatile compounds are removed from the area and do not fall back onto the substrate.

The gases suitable for use as the reactive sputtering atmosphere are the fluorinated methanes or fluorochloromethanes having the formula $CX_nF_{4-n}$ wherein X can be hydrogen or chlorine and $n$ is an integer of 0–4. These gases are inert to the substrate under normal conditions. However, when a discharge is initiated, the substrate is bombarded with energetic ions and also is in contact with a high flux of these inert gas molecules due to the relatively high pressures employed during sputtering. Thus, these inert gas molecules dissociate on the substrate surface due to impact with the ions to form short lived, but highly reactive species. These reactive species immediately react with the substrate surface to form volatile species which can be readily removed by pumping. Etching of the substrate occurs only where ions bombard the surface. The concentration of reactive species in the plasma is very small, therefore no undercutting is observed.

For example, it is believed that when tetrafluoromethane is employed as the reactive gas, $CF_3^+$ is formed in the radio frequency plasma which will physically sputter etch both photoresist and silicon oxide for example. Highly reactive fluorine radicals, formed by ion-induced dissociation on the substrate surface, react with the substrate to form volatile reaction products, such as $SiF_4$, which are readily removed.

Figure 4:
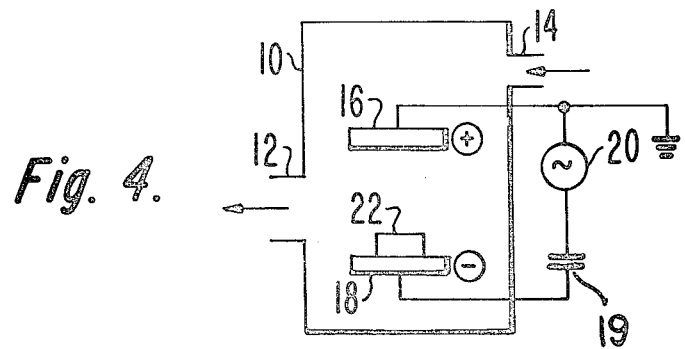
FIG. 4 is a cross-sectional view of an apparatus suitable for carrying out the process of the present invention.

Apparatus suitable for carrying out the present process is shown in FIG. 4 which shows a conventional RF diode sputtering apparatus which operates at 13.56 mHz. A housing 10 has a gas exit line 12 and a gas inlet line 14. A first electrode 16, which can be an 8 inch (20.3 cm) diameter circular plate and a second electrode 18, which can be a 5 inch (12.7 cm) diameter circular plate coated with an inert material such as quartz, are situated opposite each other about 5 cm apart. The first electrode is connected to the ground terminal and the second electrode is connected to the high voltage terminal of an rf power supply 20. The substrate 22 to be sputter etched rests on the second electrode 18 coupled via a blocking capacitor 19, which develops a dc voltage on the substrate 22.

In operation, the substrate 22 to be etched is placed on the second electrode 18 and the housing 10 is evacuated, suitably to a pressure of about $1-5 \times 10^{-6}$ torr. The etch gas is then admitted through gas inlet line 14 up to a pressure of about 2–20 millitorr. The voltage is applied so that the power is about 50–60 watts, (0.5–0.6 W/cm$^2$) about 200–700 volts, depending on the kind and pressure of the gas. The etch gas is ionized to form positive ions which impinge perpendicularly onto the second electrode 18 (biassed negatively) which carries the substrate 22. These ions remove material by physical sputtering and they induce the dissociation of the inert gas molecules on the substrate surface to form highly reactive species. The reaction products are volatile materials and are pumped away. The ions follow the electric field lines which are perpendicular to the substrate surface. This results in a pattern which has straight walls and sharp delineation, even at micron dimensions, which is required for the above-described application and avoids undercutting.

The pressure during reactive sputter etching is not critical insofar as the resolution of the sputtered profile is concerned, although it will have a bearing on the etch rate. The higher the pressure, and the more gas molecules are present, the higher the etch rate. Optimally, the gas pressure should be on the order of 2–20 millitorr to maintain the etch rate at a desirable level, e.g. 200–400 angstroms per minute.

The optimum pressure is also dependent on the nature of the reactive gas employed. Lower pressures and higher voltages are preferred using tetrafluoromethane for example, whereas higher pressures and lower voltage are employed for trifluoromethane.

In general the highest power is employed for a particular pressure that will not heat the photoresist masking pattern up to melt temperatures. Again, the lower the pressure, the higher the voltage that will be required for efficient reactive sputter etching.

The substrate to be etched is chosen so that it has a fairly rapid etch rate in the gas used. Silicon monoxide, silicon dioxide, quartz or a layer of silicon monoxide on a glass substrate, are suitable for use with the above described fluorinated methanes, and they are also hard and durable materials which can be used as masters.

Figure 5:
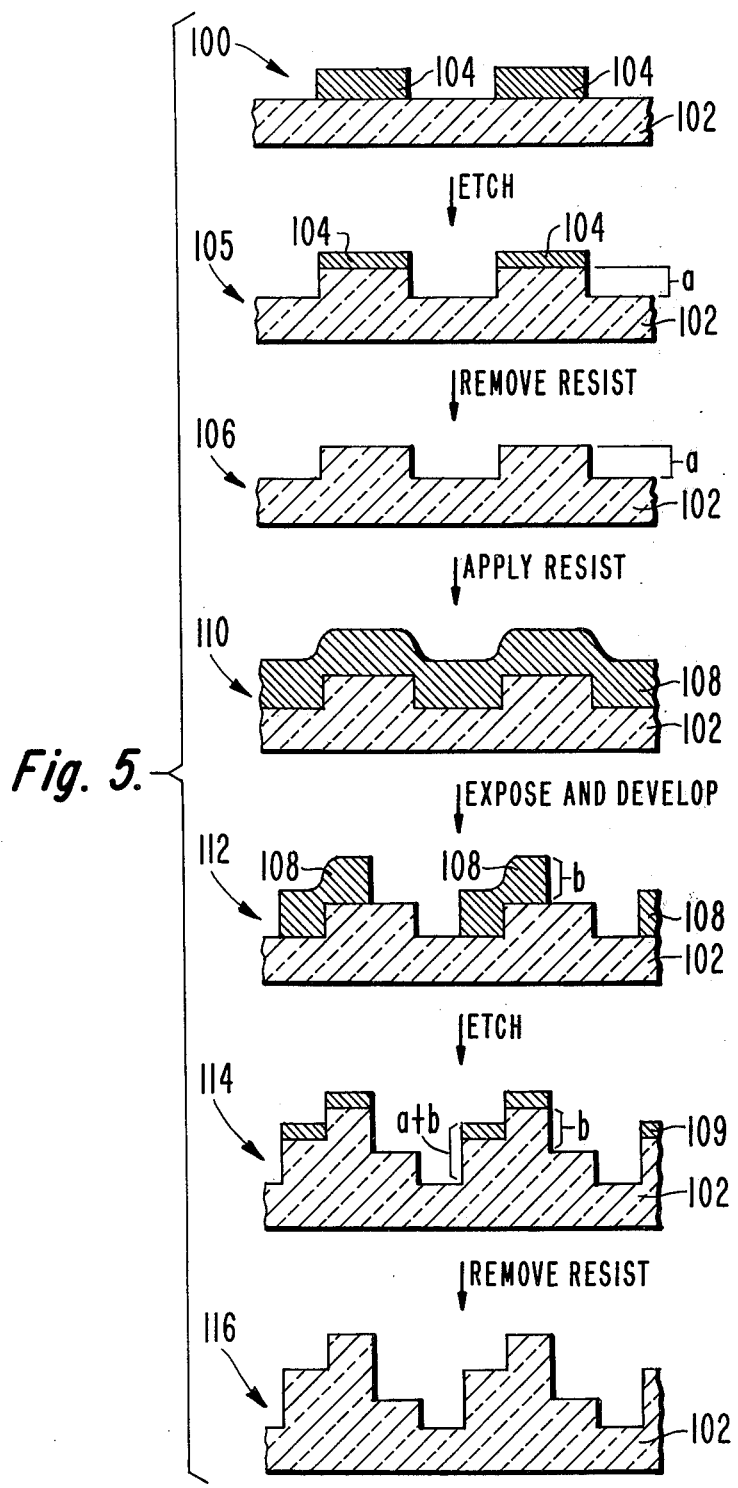
FIG. 5 is a process diagram exemplifying the steps of the present invention.

In making a master for the above described diffraction gratings, reference is made to FIG. 5. Profile 100, comprising substrate 102 having photoresist stripes 104 on a surface thereof, is etched in accordance with the above described process to form pattern 105 having a first depth $a$. The remaining photoresist 104 is removed to form profile 106. The substrate 102 is now coated with a second layer of photoresist 108, as shown in profile 110. This layer of photoresist 108 is exposed and developed to form profile 112.

The exposed substrate 102 is not etched to a second specified depth, $b$, to form a multi-level profile 114. The photoresist 108 is now removed to form the desired four level relief pattern shown in profile 116, which four levels consist of depths $o$, (initial) $a$, $b$ and $(a + b)$. It is apparent that the depths depend on the sputtering rate and time rather than on the thickness of the photoresist layer, provided some photoresist remains when etching of the substrate is completed. The etch rate can be controlled by etching for a given time at a constant rf power and gas pressure; or, more accurately, by monitoring the etching process by optical interference techniques or by periodic measurement of the edge depth.

The invention will be further described in the following Examples, but it is to be understood that the invention is not meant to be limited to the details described therein.

EXAMPLE 1

A glass plate coated with a silicon monoxide film about 5 microns thick was spin coated with a ½ micron thick layer of Shipley Co.'s AZ 1350 photoresist and dried at 80° C. for 30 minutes.

The photoresist film was exposed to a grating pattern having a periodicity of 1.4 microns by contact printing through a chromium mask with ultraviolet light from a 500 watt mercury lamp for 2 minutes. The photoresist was then developed by immersing the plate for about 15 seconds in AZ 1350 developer diluted 1:1 by volume with water. A square profile relief pattern was formed in the resist. The resist was hardened by baking at about 100° C. under vacuum for 2 hours.

Figure 6:
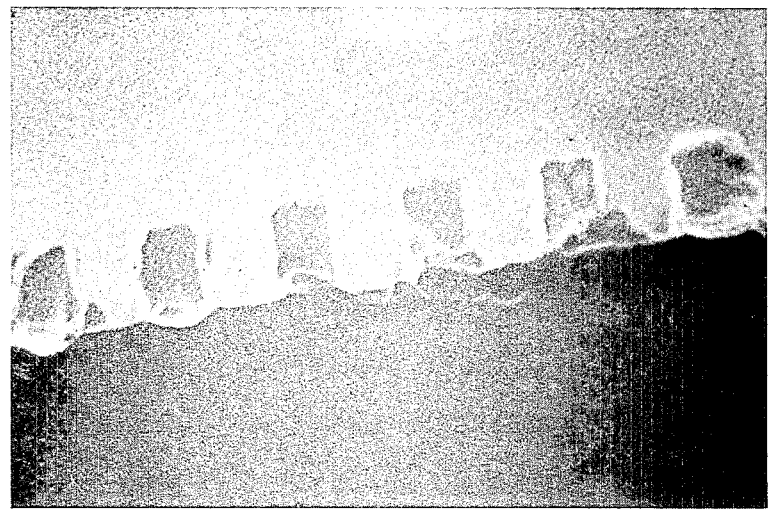
FIGS. 6-9 are photomicrographs exemplifying the surface relief patterns obtained by practicing the present invention.
Figure 7:
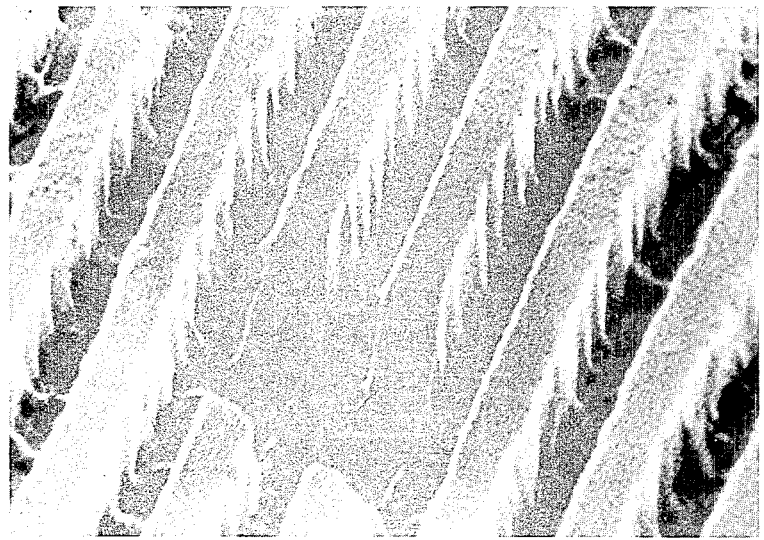

The photoresist patterned glass plate was placed on a water cooled substrate table in a conventional RF diode sputtering apparatus as in FIG. 4. The vacuum chamber was evacuated to a pressure of $5 \times 10^{-6}$ torr and tetrafluoromethane was added until the pressure reached 2 millitorr. A voltage of 700 volts (50 watts, 0.5 W/cm$^2$) was applied to the electrodes for 1 hour. The photoresist was etched at a rate of about 140 angstroms per minute and the silicon monoxide etched at about 170 angstroms per minute. The remaining photoresist was then removed with acetone. A square wave grating about 1 micron deep was etched into the silicon monoxide layer. The grating obtained can be seen in FIGs. 6 and 7 which are photomicrographs taken at 15,000 and 14,300 times respectively.

EXAMPLES 2-5

The procedure of Example 1 was followed, except varying the sputtering gas atmosphere and sputtering a variety of substrate materials at a power of 50 watts. The etch rates in angstroms per minute were compared with an argon control. The data is presented in Table 1 below.

EXAMPLE 6

Two square wave grating patterns having periodicities of 2.8 microns were superposed in a fused quartz glass substrate by successive exposure, development and etching of AZ 1350 photoresist layers. The first surface relief pattern was reactively sputter etched following the procedure of Example 1 using trifluoromethane as the reactive atmosphere. The sputtering conditions were 14 millitorr pressure of trifluoromethane and the DC voltage applied was 340–410 volts (60–70 watts). Etching was continued to a depth of about 1.25 microns.

The second pattern was superposed by applying the photoresist, exposing and developing it as before with the second pattern and sputter etching as above to a depth of 1.86 microns.

Figure 8:
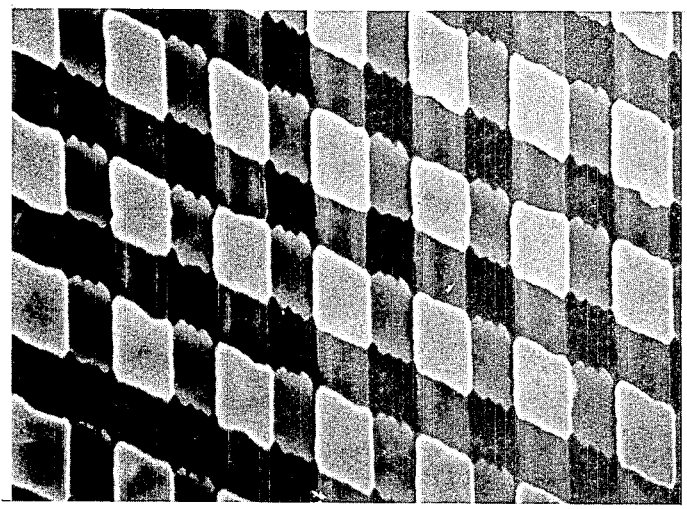
Figure 9:
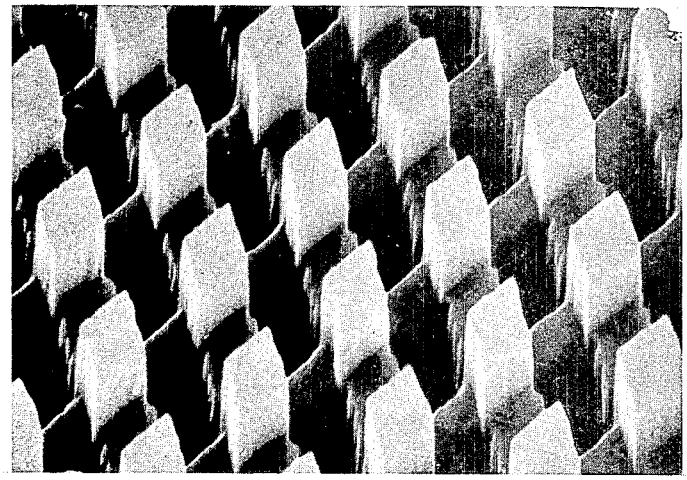

The excellent resolution and straight side walls of the pattern can be seen in FIGS. 8 and 9 which are photomicrographs taken at 4500 and 5700 times magnification respectively.

We claim:

1. In the method of making a multi-level straight walled square wave diffration grating having a periodicity of less than 5 microns on the surface of a substrate which comprises:
   coating said substrate with a photoresist,
   exposing said photoresist through a mask and developing said photoresist so as to provide a first surface relief pattern,
   etching said pattern into said substrate to a first depth corresponding to a predetermined primary color,
   recoating said etched substrate with photoresist,
   exposing said photoresist through a mask and developing said photoresist so as to provide a superposed second surface relief pattern, and
   etching said pattern into said substrate to a second depth corresponding to another predetermined primary color,
   the improvement which comprises carrying out said etching steps by sputter etching at a rate of about 200–400 angstroms per minute in the presence of a reactive gas at a pressure of from 2–20 millitorr, which gas has the formula $CX_nF_{4-n}$ wherein X is hydrogen or chlorine and $n$ is an integer from 0–4 which forms volatile byproducts with the sputtered material and
   removing said byproducts.

2. A method according to claim 1 wherein the rate of etching is about the same for said photoresist and for said substrate.

* * * * *

TABLE 1

| | | | Substrate Materials | | | | | | | | |
|---|---|---|---|---|---|---|---|---|---|---|---|
| Example | Gas | Gas Pressure | Al | Cr | Cu | W | Pt | Au | SiO$_2$ | Si | Shipley AZ 1350 | Waycoat 28* |
| 2 | CF$_4$ | 11 microns | 47 | 20 | 7 | 115 | 47 | 87 | 288 | 200 | 254 | 284 |
| 3 | CHF$_3$ | 10 microns | 32 | 12 | 28 | 26 | 27 | 74 | 220 | 15 | 50 | 70 |
| 4 | CHClF$_2$ | 10 microns | 34 | 15 | 123 | 80 | 27 | 73 | 210 | 28 | 50 | 70 |
| 5 | CCl$_2$F$_2$ | 10 microns | 43 | 20 | — | 155 | 63 | 103 | 190 | 217 | 163 | 220 |
| Control | Argon | 11 microns | 14 | 15 | 57 | 28 | 50 | 109 | 11 | 10 | 210 | 200 |

*a commercially available photoresist